United States Patent [19]
Doering et al.

[11] Patent Number: 5,855,675
[45] Date of Patent: Jan. 5, 1999

[54] MULTIPURPOSE PROCESSING CHAMBER FOR CHEMICAL VAPOR DEPOSITION PROCESSES

[75] Inventors: Kenneth Doering, San Jose; Carl J. Galewski, Aromas, both of Calif.

[73] Assignee: Genus, Inc., Sunnyvale, Calif.

[21] Appl. No.: 810,255

[22] Filed: Mar. 3, 1997

[51] Int. Cl.[6] .................................................. C23C 16/00
[52] U.S. Cl. .......................... 118/719; 118/725; 118/728; 118/729; 219/451; 219/465; 219/466; 174/151; 174/65 R; 174/65 SS; 174/88 S; 439/559; 439/252
[58] Field of Search ..................................... 118/719, 725, 118/728, 729; 219/465, 466, 451; 174/151, 65 R, 65 SS, 88 S; 439/559, 252

[56] References Cited

U.S. PATENT DOCUMENTS

| | | | |
|---|---|---|---|
| 5,078,851 | 1/1992 | Nishihata | 118/725 |
| 5,156,820 | 10/1992 | Wong | 118/725 |
| 5,294,778 | 3/1994 | Carman | 219/385 |
| 5,582,866 | 12/1996 | White | 118/725 |

*Primary Examiner*—Richard Bueker
*Attorney, Agent, or Firm*—Donald R. Boys

[57] ABSTRACT

A processing station adaptable to standard cluster tools has a vertically-translatable pedestal having an upper wafer-support surface including a heater plate adapted to be plugged into a unique feedthrough in the pedestal. At a lower position for the pedestal wafers may be transferred to and from the processing station, and at an upper position for the pedestal the pedestal forms an annular pumping passage with a lower circular opening in a processing chamber. A removable, replaceable ring at the lower opening of the processing chamber allows process pumping speed to be tailored for different processes by replacing the ring. In some embodiments the pedestal also has a surrounding shroud defining an annular pumping passage around the pedestal. A unique two-zone heater plate is adapted to the top of the pedestal, and connects to a unique feedthrough allowing heater plates to be quickly and simply replaced. In some embodiments the top of the processing chamber is removable allowing users to remove either pedestals or heater assemblies. Or both, through the open top of a processing station.

19 Claims, 13 Drawing Sheets

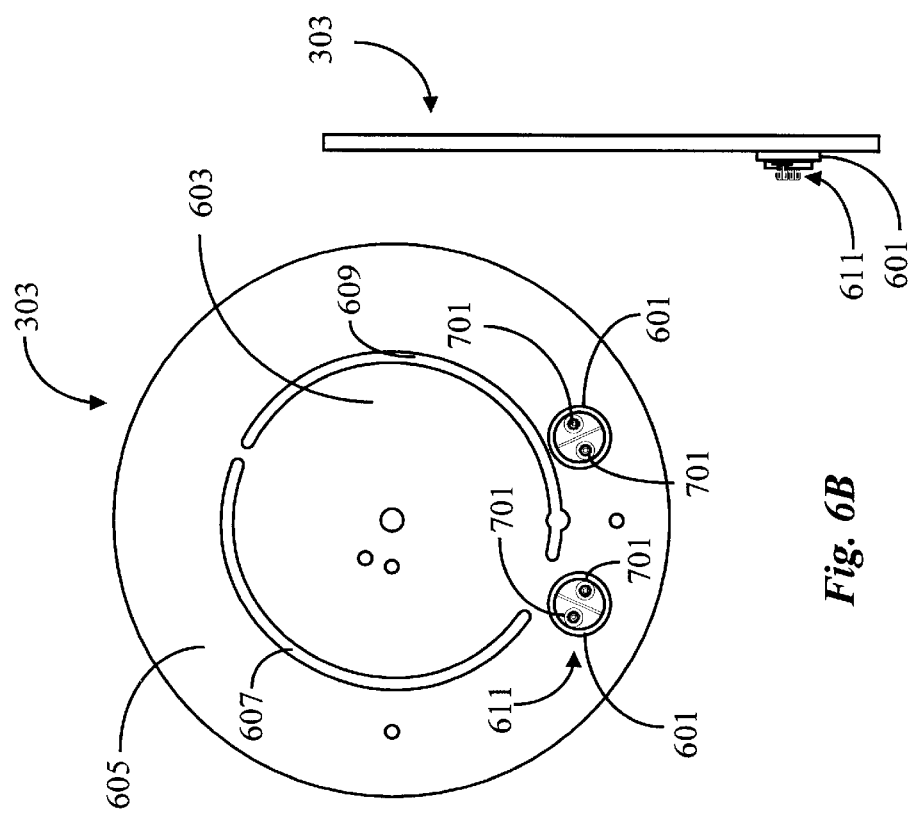
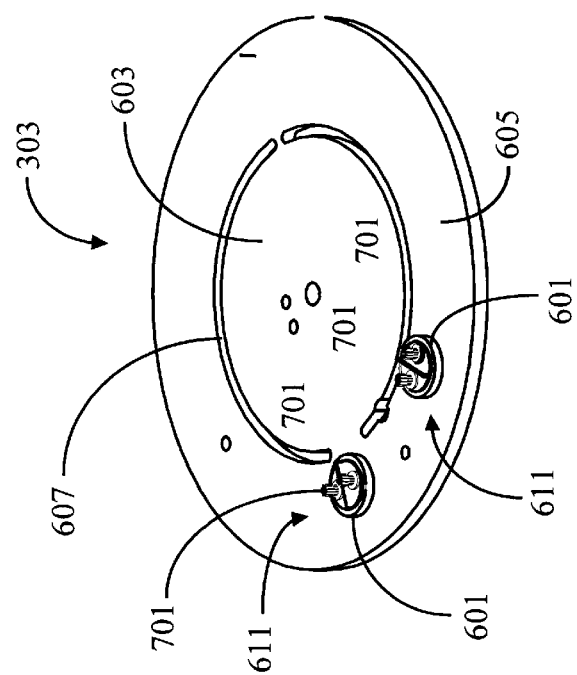

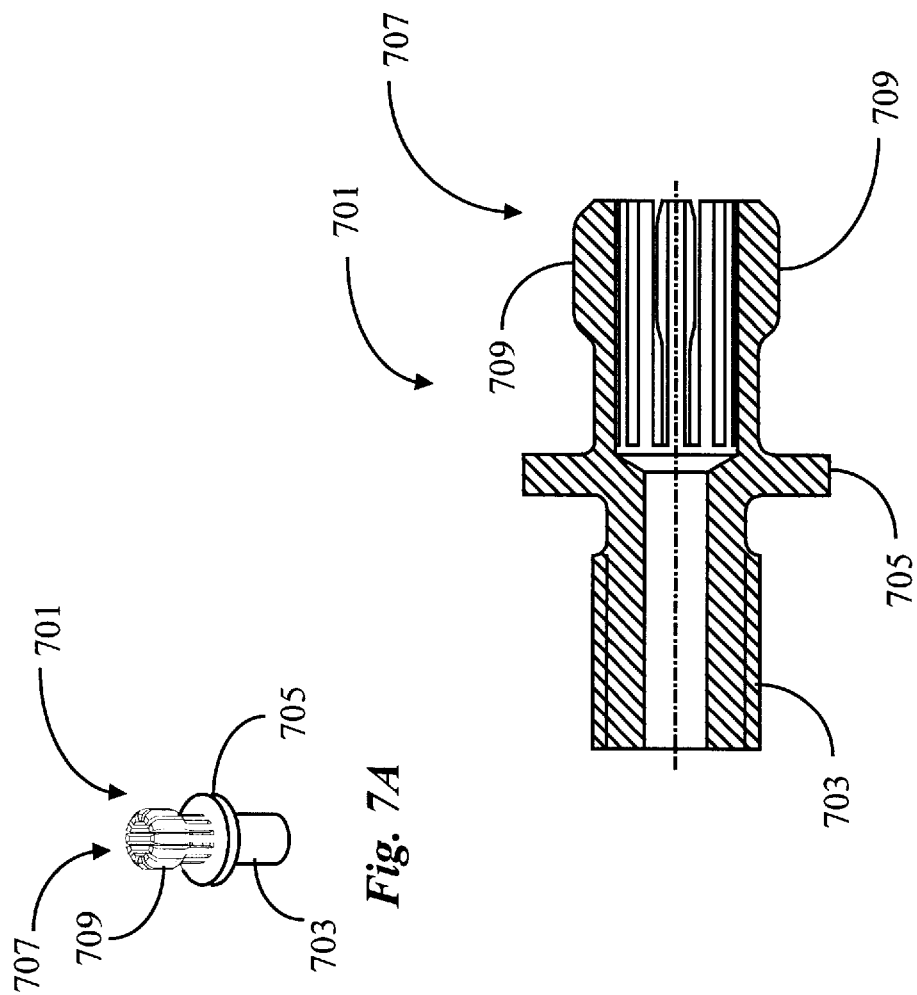
*Fig. 7A*  *Fig. 7B*  *Fig. 7C*

MULTIPURPOSE PROCESSING CHAMBER FOR CHEMICAL VAPOR DEPOSITION PROCESSES

FIELD OF THE INVENTION

This invention is in the field of apparatus and methods for performing Chemical Vapor Deposition (CVD) Processes, and pertains more particularly to a multipurpose processing chamber that may be adapted to a broad range of CVD processes.

BACKGROUND OF THE INVENTION

Manufacturing of integrated circuits is generally a procedure of forming thin films and layers of various materials on wafers of base semiconductor material, and selectively removing areas of such films to provide structures and circuitry. Doped silicon is a typical base wafer material. There are a number of known processes for depositing layers in IC manufacturing, one of which is chemical vapor deposition (CVD).

CVD is a well-know way to deposit thin films and layers of materials that can be introduced to a process in a gaseous or vapor form. For example, polysilicon may be deposited from silane gas, $SiH_4$. It is known, too, to deposit tungsten silicide from a mixture of gases including silane and a tungsten-bearing gas such as tungsten hexafluoride. Pure tungsten is also deposited on silicon wafers in the manufacture of integrated circuits, sometimes selectively and sometimes across the entire surface in a process known as "blanket" tungsten.

In a typical CVD process wafers are placed on supports within a sealable chamber, the chamber is sealed and evacuated, the wafers are heated, typically by heating the wafer support, and a gas mixture is introduced into the chamber. For example, in the blanket tungsten process, tungsten hexafluoride ($WF_6$) and hydrogen are introduced as reactive gases and argon may be introduced as a non-reactive carrier gas. The ($WF_6$) is the source of deposited tungsten.

Typically gases in a CVD process are flowed continuously during processing. The temperature of a substrate (wafer) to be coated is one of the variables that drives the chemical reaction to cause tungsten to be deposited on the wafer surface. It is important to control the temperature, the concentration of various gases in the mixture introduced, and such characteristics as the uniformity of flow of gas over the surface being coated, among other variables. An even thickness of a deposited layer is a critical characteristic.

Over the history of CVD processing a number of different sorts of CVD processes have been developed. In some processes a single atomic material is deposited, while in other processes a chemical combination of materials or a mixture of two or more materials may be deposited by introducing gases bearing the different materials.

In many CVD processes the chemistry is endothermic, and deposition is driven by added heat. In most cases the heat is added in the process by directly heating the substrate to be coated. In other processes a plasma is induced in the process chamber, and energy is added to drive the necessary chemistry by a high-frequency power supply.

Historically the many sorts of deposition processes that have been developed have led to highly individual and specialized deposition apparatus, such as processing chambers and apparatus for introducing energy and process gases. Equipment design has also evolved from single-chamber, single-substrate systems to batch processing systems capable of processing several substrates simultaneously, and finally to isolated single chamber processing stations served by robotic transfer apparatus through air locks and high vacuum transfer chambers, wherein a steady stream of substrates may be moved through a sequence of different processes. These latter systems, allowing isolated sequential processing of substrates are based on material handling equipment known in the art as cluster tools. It is to these later cluster tool designs to which the present invention pertains.

In the semiconductor equipment manufacturing industry at the time of the present patent application the design of cluster tools has been standardized to the point that modular components may be used from a variety of manufacturers in a single system. For example, a cluster tool transfer system manufactured by one supplier, may be adapted to deposition and conditioning processing stations manufactured by other suppliers. In this manner a very wide variety of processing stations has been developed.

This wide variety of processing stations available is not always an advantage. For example, when it becomes necessary to change the process or the order of processes in a cluster-tool-based system, it is conventionally necessary to completely remove and replace some or all of the processing stations adapted to a cluster tool transfer apparatus. This procedure of reestablishing the entire architecture of such a system is far from trivial, and requires a long and arduous sequence of tasks involving all of the power, gas feed and control connections, as well as physically replacing vacuum chambers and vacuum pumping apparatus.

What is clearly needed is a multipurpose processing chamber that provides a common platform to operate a broad variety of CVD and plasma-enhanced CVD processes, as well as conditioning processes such as dry etching. Such a multipurpose processing station is the subject of the disclosure and teachings of the present invention.

SUMMARY OF THE INVENTION

In a preferred embodiment of the present invention a processing station for a cluster tool system is provided, comprising a processing chamber portion having a substantially circular lower extremity with a first inside diameter; a base chamber portion below the processing chamber portion, the base chamber portion having a vacuum pumping port and a substrate transfer port, and a second inside diameter between the circular lower extremity of the processing chamber and the vacuum pumping port greater than the first inside diameter; a substrate support pedestal having a substantially circular upper support surface with an outside diameter less than the first inside diameter and adapted to the base chamber portion below the transfer port by a dynamic vacuum seal allowing vertical translation; and a vertical-translation drive system adapted to translate the substrate support pedestal to place the upper support surface at a processing position even with the substantially circular lower extremity of the processing chamber, or at a lower transfer position in the base chamber portion above the pumping port and below the transfer port. With the substrate support pedestal at the processing position the outside diameter of the substrate support pedestal and the larger first inside diameter form a first annular pumping passage having a first annular area determining a first limited pumping speed from the processing chamber portion through the vacuum pumping port, and with the substrate support pedestal at the lower transfer position, the outside diameter of the substrate support pedestal and the larger second inside diameter form a second annular pumping passage having a second annular area greater area than the first annular area, allowing a second pumping speed from the processing chamber greater than the first limited pumping speed.

In some embodiments the first inside diameter is formed by a replaceable ring, thereby allowing the first pumping speed to be incrementally varied by interchanging replaceable rings having constant outer diameter and differing inner diameter. Also in some embodiments there is an annular shroud surrounding a portion of the substrate pedestal beginning at the substantially circular upper support surface and extending below the substantially circular upper support surface, wherein the diameter of the annular shroud at the height of the substantially circular upper support surface is substantially equal to the first inside diameter, such that, with the substrate support pedestal in the processing position the annular shroud mates with the first inside diameter constraining all gas flow from the processing chamber to flow within the annular shroud between the annular shroud and the substrate support pedestal.

In some embodiments there is a demountable lid closing an upper extremity of the processing chamber and the dynamic vacuum seal is a demountable seal, such that the lid and the dynamic vacuum seal may be demounted, allowing the substrate support pedestal to be withdrawn from within the base chamber region upward through the processing chamber region. The demountable lid may include a gas distribution system for providing processing gases evenly over an exposed surface of a substrate supported on the substrate support pedestal with the substrate support pedestal in the processing position.

In an aspect of the invention the substrate support pedestal comprises a closure plate parallel with the upper support surface and forming a vacuum boundary for the processing chamber, a heater plate on the processing chamber side thermally-insulated from the closure plate, and an electrically-isolated susceptor spaced-apart from and above the heater plate, the susceptor forming the upper support surface. In some embodiments the heater plate a substantially circular heater plate having separately-powered inner and outer heating regions, allowing temperature profile across the plate to be managed by managing power to the separately-powered inner and outer heating regions. The inner heating region may be separated from the outer heating region by one or more circular-arc grooves through the heater plate.

In another aspect of the invention the heater plate is assembled to the substrate support pedestal by a unique electrical connector comprising at least one electrical contact post extending at a right angle from the plane of the substantially planar heater plate, the electrical contact post comprising a plurality of electrically-conductive, cantilevered-spring fingers arranged in a circular pattern and adapted to engage an electrically conductive hollow cylindrical socket to provide electrical contact. In many embodiments two or more such posts are used.

In another aspect of the invention the heater plate having unique posts mates with a unique feedthrough comprising a body having a flange and vacuum seal arrangement adapted to mount through an opening through a vacuum barrier wall, presenting thereby a vacuum side and a non-vacuum side through the vacuum barrier wall, and having also a non-electrically-conductive portion presented to both the vacuum side and the non-vacuum side with first circular openings having a first depth and a first inside diameter opening to the vacuum side; electrically-conductive posts sealed through the non-conductive portion from the non-vacuum side into the first circular opening on the vacuum side; and electrically-conductive sockets having a second circular opening and an outside diameter less than the first inside diameter, the electrically conductive sockets mounted in the first circular openings in the non-electrically-conductive portion and connected to the electrically conductive posts within the first circular openings. In this embodiment the electrically-conductive sockets are free to move laterally within the first circular openings, but are not free to move along the direction of the first depth.

In some embodiments of the invention an electrically-insulating member is adapted to be interposed between a heater plate at the position of the electrical contact posts, and the unique electrical feedthrough in a manner such that a ceramic wall is presented between the electrically-conductive posts and sockets, preventing line-of-sight engagement of the posts, which serves to alleviate short circuiting.

In various embodiments of the invention, the processing station provided is much more versatile than stations available in current art. The stations provided in various embodiments of the invention provide for easily and readily adjusting pumping speed, for example, with the lift pedestal in processing position. In addition the process chamber size and configuration may be easily adjusted by exchanging chamber structures. Further, the exchangeable lid apparatus allows one to provide different electrode and gas distribution systems to customize process capability. In like manner routine service and cleaning may be done more readily than in known processing stations in the art.

BRIEF DESCRIPTION OF THE DRAWINGS

FIG. 6A is an isometric view of a two-zone heater plate in an embodiment of the present invention.

FIG. 6B is a plan view of the heater plate of FIG. 6A.

FIG. 6C is a side view of the heater plate of FIG. 6A.

FIG. 7A is an isometric view a connector post in an embodiment of the present invention.

FIG. 7B is an end view of the connector post of FIG. 7A.

FIG. 7C is a section view of the connector post of FIG. 7A and FIG. 7B.

DESCRIPTION OF THE PREFERRED EMBODIMENTS

Figure 1A:
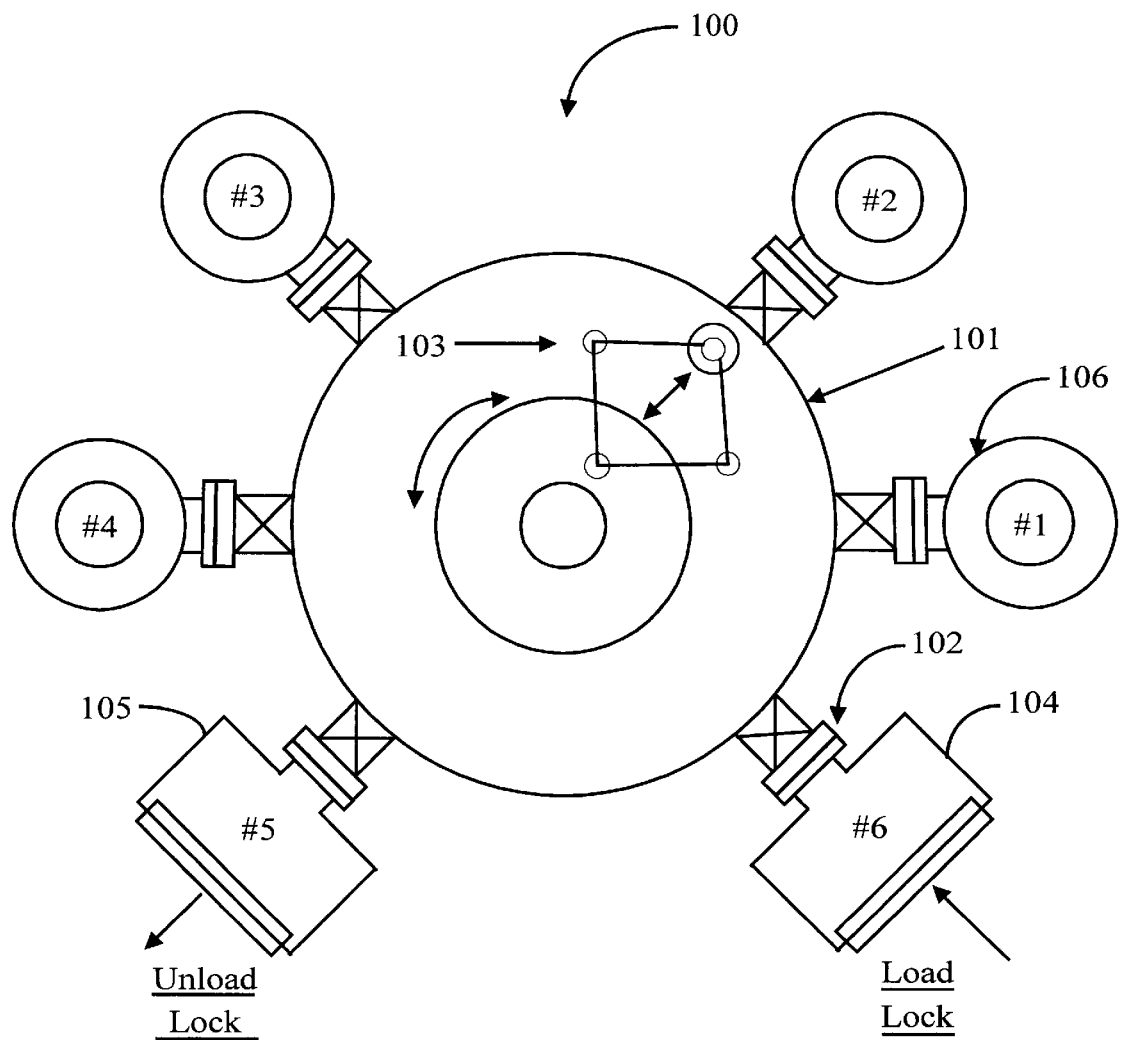
FIG. 1A is an idealized plan view of a cluster-tool-based processing system as known in the art, and as used in embodiments of the present invention.

FIG. 1A is a mostly diagrammatical plan view of a cluster-tool-bases processing system as used both in the prior art and in practicing the present invention. The cluster tool itself is a material handling system operating substantially within a vacuum chamber 101. A wafer transfer apparatus 103 is positioned to operate from the center of the vacuum chamber, and is adapted to place and retrieve, by rotation and extension, substrates, typically semiconductor wafers in IC manufacturing sequences, from and to processing station appended at points around the periphery of substantially circular vacuum transfer chamber 101.

In the system shown there are 6 station positions numbered 1 through 6, and each of these stations is adapted to chamber 101 by a mounting flange and slit valve arrangement 102. In this scheme two stations, 5 and 6, are used as airlocks for bringing wafers into and out of chamber 101, which is held under high vacuum by pumping apparatus not shown, and the remaining four stations 1–4 are available for processing.

Wafers are moved from outside into chamber 101 through load-lock 104, then typically sequentially through the four processing stations, and back to outside through unload lock 105. It is not necessary, however, that the wafers move sequentially through the four processing stations, as transfer apparatus 103 is capable of placing and retrieving in any desired order.

Figure 1B:
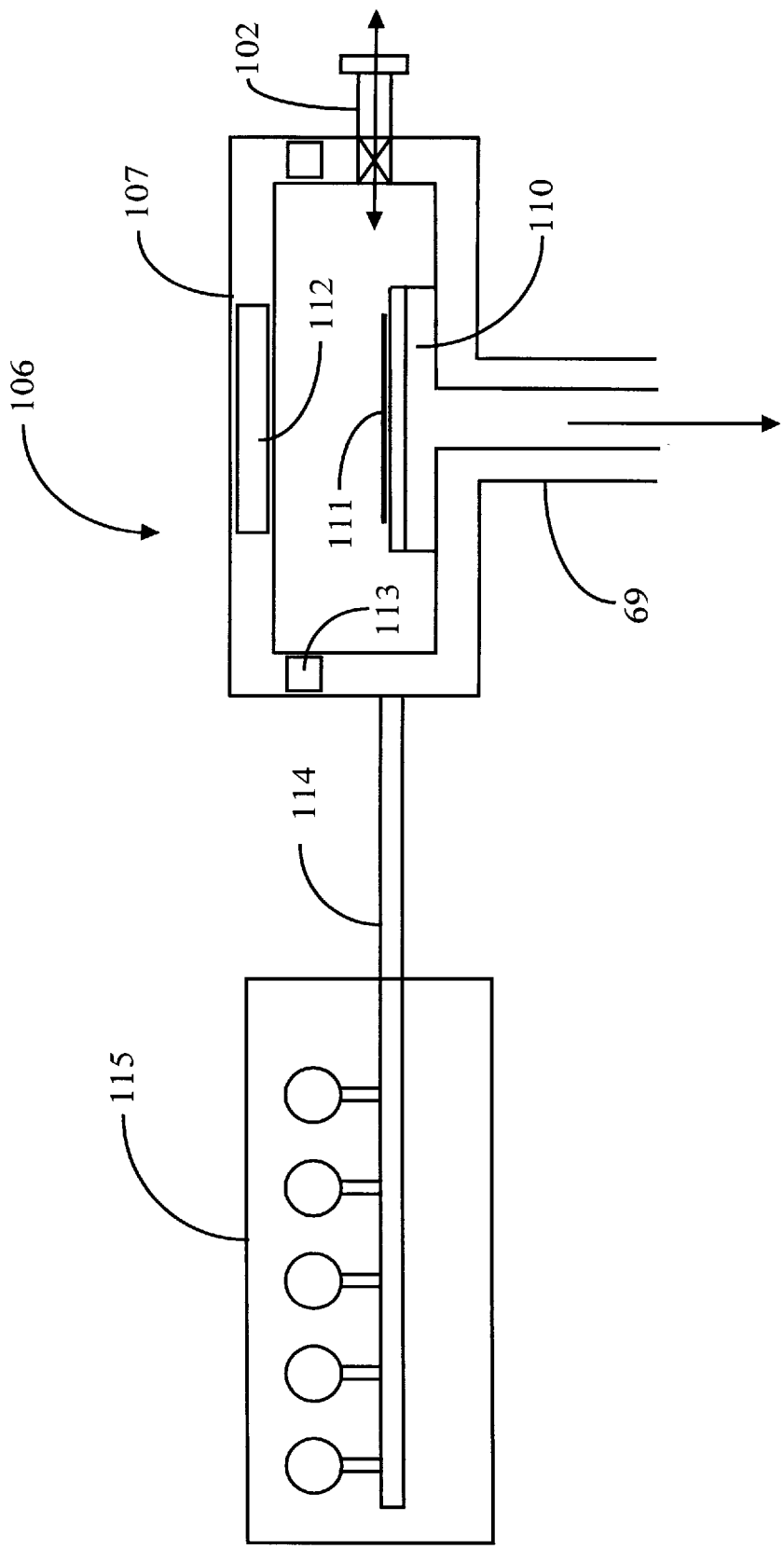
FIG. 1B is a cross-section elevation view, mostly diagrammatical, of a conventional CVD processing station as known in the art.

FIG. 1B is a cross-section elevation view of station 106 of FIG. 1A, showing some additional typical features of such a processing station. Station 106 is based on a sealable process chamber interfacing to chamber 101 of FIG. 1A through flanged slit valve apparatus 102. It is through this interface that wafers are brought into chamber 107 for processing, and removed from chamber 107 after processing. Chamber 107 has a vacuum pumping port 109, through which the chamber is evacuated, and a heatable hearth 110 for supporting a wafer 111 during processing. Gases used in processing are introduced from a gas feed and control unit 115 through conduit(s) 114 via ring manifold 113 and showerhead manifold 112.

In the system of FIG. 1A, chamber 101 is pumped by substantial vacuum pumps at all times to keep all of the volume in the chamber under high vacuum. The purpose is to avoid contamination by atmospheric gases between processing stations. Wafers to be processed are placed in load-lock chamber 104, typically in a carrier, and the load-lock is evacuated to a vacuum level on the order of the vacuum level in chamber 101. An inner valve is then opened, and wafers may then be retrieved from the load-lock by transfer apparatus 103 and transferred to any one of processing stations 1–4.

Typically during processing in one of the processing stations, vacuum pumping is throttled to control process chamber pressure without using excessive quantities of process gases. Such throttling may be accomplished in a number of ways, including valves having controllable openings. In a typical process cycle, after processing is complete, gases are valved off in unit 115 (FIG. 1B), and the throttling mechanism is opened to allow maximum pumping speed in the processing chamber. The purpose is to reduce the gas pressure in the processing chamber to a value close to that in transfer chamber 107. Then the slit valve in apparatus 102 is opened, and transfer apparatus 103 enters the processing chamber and retrieves the processed wafer (111). The retrieved wafer is typically transferred via apparatus 103 to another processing station, then a wafer from the load-lock or from another processing station is inserted and placed on hearth 111, after which the transfer apparatus withdraws.

Once a new wafer is on the hearth in the processing chamber, the slit valve associated with apparatus 102 is closed again, isolating the process chamber from transfer chamber 101. Then process gases are introduced from unit 115 through conduit(s) 114 and pumping speed is throttled.

There are, as was briefly described above, many processes that are accomplished in processing stations of the general nature described with reference to FIGS. 1A and 1B. Cleaning, etching, backsputtering, and many different deposition recipes may be accomplished, for example. Typically each process is served by a chamber specifically designed for that process.

Figure 2A:
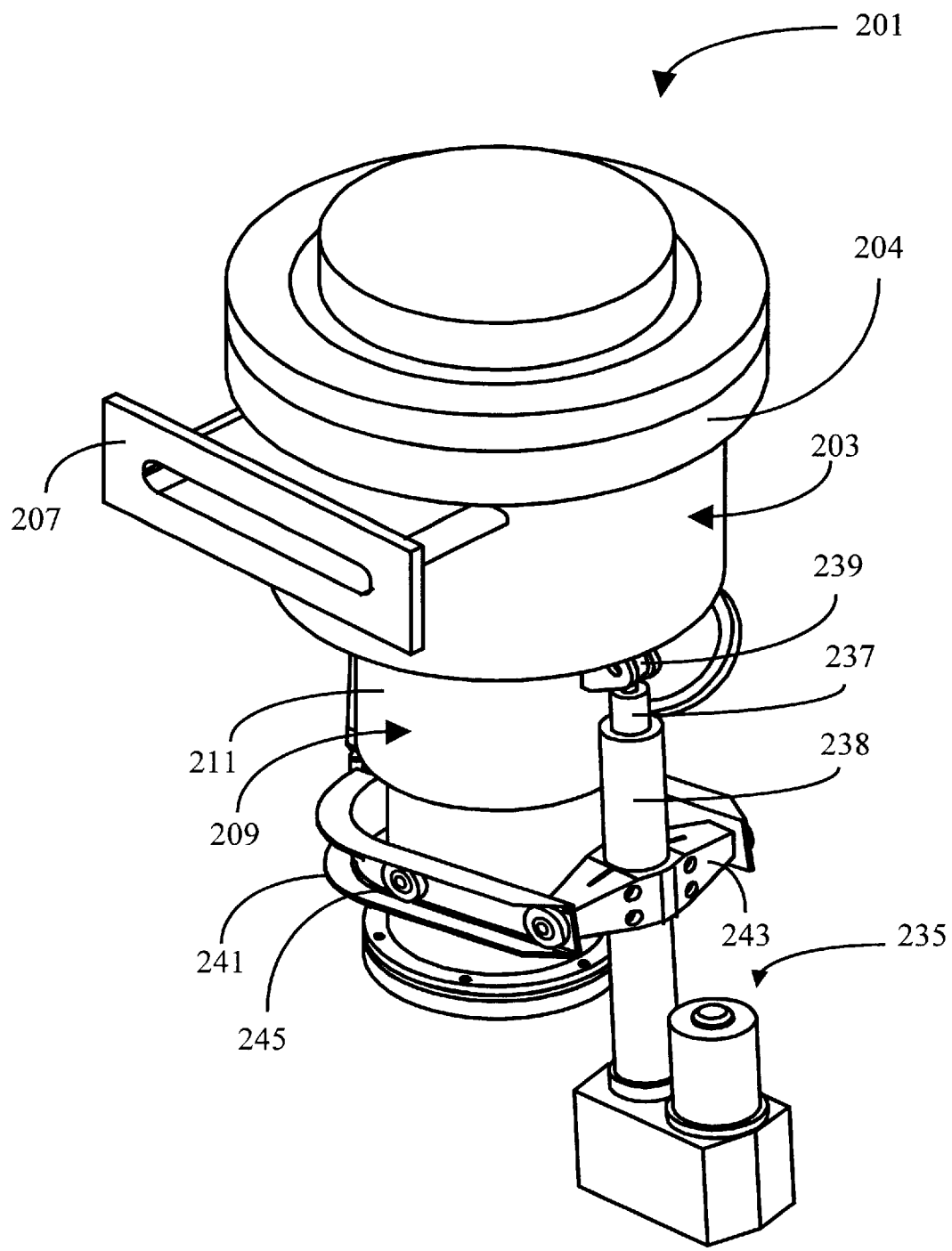
FIG. 2A is an isometric view of a multipurpose processing station according to a preferred embodiment of the present invention.
Figure 2B:
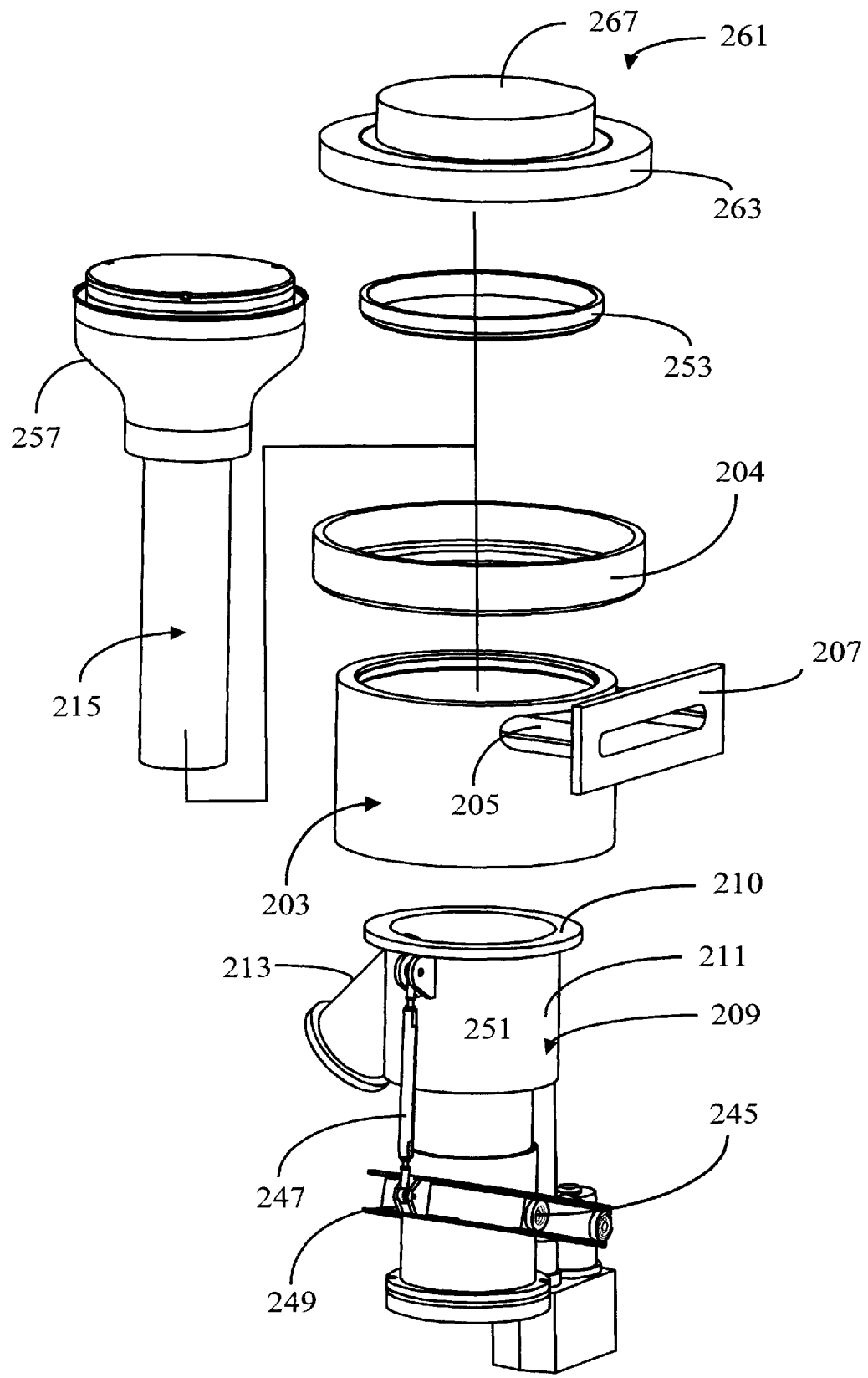
FIG. 2B is an exploded view of the multipurpose processing chamber of FIG. 2A.
Figure 2C:
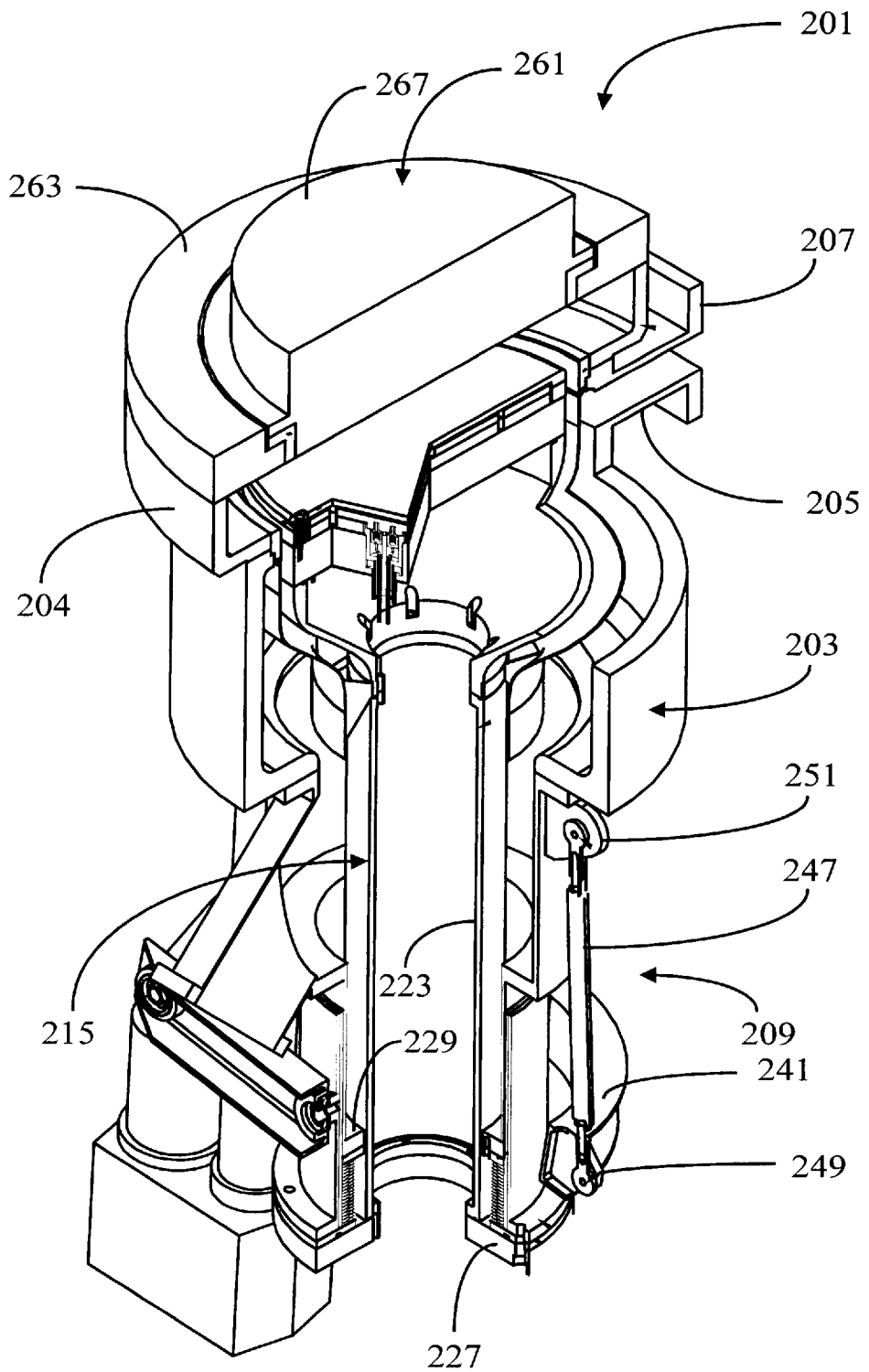
FIG. 2C is an isometric, cutaway elevation view of the multipurpose processing station apparatus of FIG. 2A.
Figure 2D:
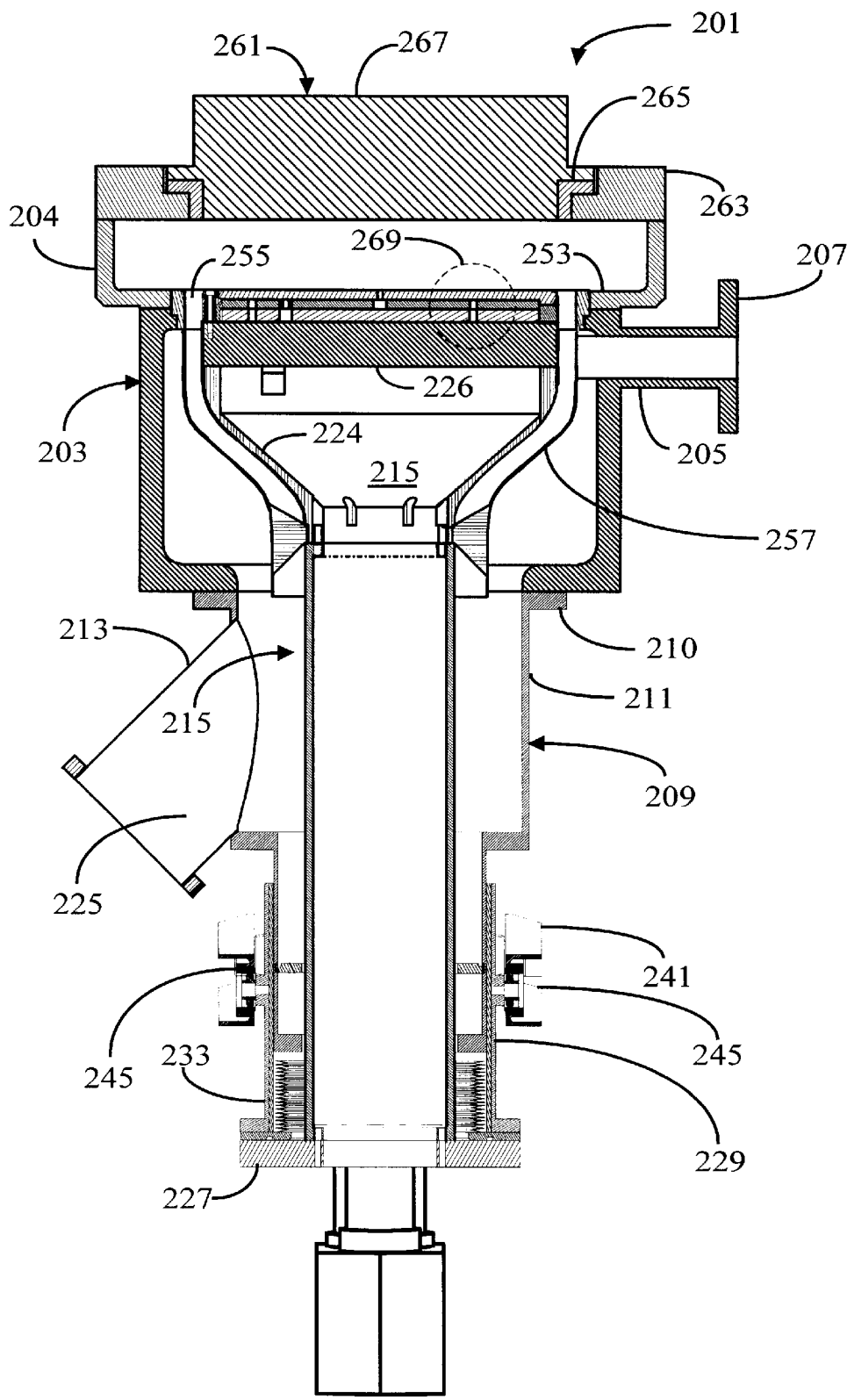
FIG. 2D is an elevation section view of the multipurpose processing chamber of FIG. 2A, shown in processing mode.
Figure 2E:
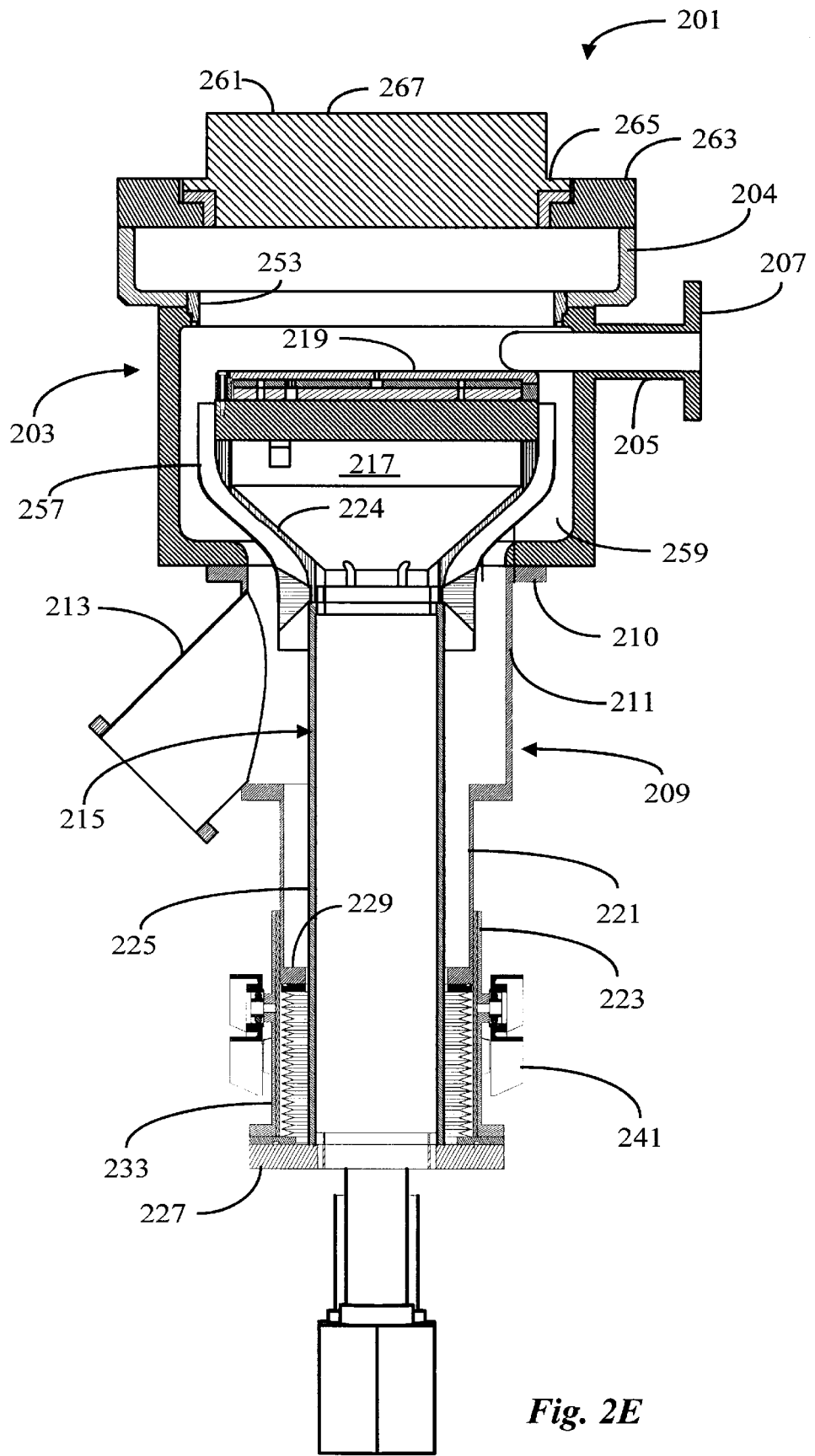
FIG. 2E is an elevation section view of the apparatus of FIG. 2A shown in transfer mode.

FIG. 2A is an isometric view of a multipurpose processing station 201 according to a preferred embodiment of the present invention, capable of performing a broad variety of processes, and FIG. 2B is an exploded view of the multipurpose processing station of FIG. 2A. FIG. 2C is an isometric, cutaway elevation view of the multipurpose processing station shown in FIGS. 2A and 2B, seen from a different perspective than that of FIG. 2A. FIG. 2D is an elevation section view of the multipurpose processing station of FIG. 2A, shown in processing mode, and FIG. 2E is an elevation section view of the apparatus of FIG. 2A, shown in transfer mode. As the multipurpose station in its embodiments is a relatively complicated apparatus, several views and sections have been provided to better illustrate the features and elements of the station, and the descriptions which follow bearing on the multipurpose processing station are best understood by reference to all of the views provided.

Referring now primarily to FIGS. 2A and 2B, multipurpose processing station 201 is attached to a cluster tool by base chamber 203, which, when assembled with other elements provides vacuum integrity. Base chamber 203 has a side extending passage 205 ending in a flange 207 which is adapted to mount to a mating flange on a cluster tool transfer apparatus in the manner that station 104 mounts to system 100 (FIG. 1A). A slit valve is not shown, and in this embodiment is a part of the cluster tool apparatus to which flange 207 mounts.

A cylindrical (in this embodiment) processing chamber 204 mounts to an upper end of base chamber 203 with vacuum seals providing vacuum integrity at the interface, and a lid assembly 261 seals to the upper end of the process chamber with vacuum seals. The lid assembly in this embodiment is hinged to the process chamber and also has apparatus for providing process gases into the process chamber. The lid assembly and associated apparatus are described more fully below. For the present portion of the description it is important to note (FIGS. 2C and 2D) that the process chamber with the lid assembly and pedestal provides a closed processing volume.

A drive assembly 209 mounts below to base chamber 203 by a horizontal flange with vacuum seals. The horizontal flange is a part of an upper cylindrical housing 211 which has a side outlet 213 for attachment to a vacuum pumping system not shown. Upper housing 211, by virtue of being rigidly mounted to base chamber 203, which is in turn rigidly mounted to the vacuum transfer chamber of a cluster tool, is a stationary element providing structural support for other elements, as will be clear from further description below.

The purpose of the drive assembly is to raise and lower an internal pedestal apparatus 215 (FIG. 2B). The pedestal apparatus has a heated hearth for supporting and providing heat to a wafer to be processed. When the pedestal is in a lowermost position wafers may be inserted into the base chamber and released to lie upon the hearth, and after the transfer apparatus withdraws through extension 205 and the associated slit valve closes, the pedestal may be raised, moving the supported wafer up into a process chamber in position to be processed.

Relationship of pedestal apparatus 215 to the drive assembly may best be seen in FIGS. 2C, 2D, and 2E. Pedestal apparatus 215 has an upper portion 217 comprising a heater plate, an electrical insulator plate, and other elements which are described in more detail in sections below. For the present description regarding the drive assembly, the connection of the pedestal apparatus to the drive assembly is of primary interest.

FIG. 2E shows pedestal apparatus 215 in its lowermost position having a wafer 219 supported on upper portion 217 of the pedestal apparatus. In this position a transfer apparatus (103 of FIG. 1A) may enter the base chamber through extension 205 and pick and place wafers on the upper portion of the pedestal apparatus. For the present description it may be assumed wafer 219 has been placed on the pedestal apparatus.

Attention is now directed to upper housing 211 of drive assembly 209. A rigid lower cylindrical housing 221, of lesser diameter than upper housing 211 extends below upper housing 211. Pedestal apparatus 215 has an upper structure 224 and a lower extension 225 ending in a flange 227 to which an outer cylindrical member 223 is also mounted, creating an annular region therebetween. Outer cylindrical member 223 is lined with a bearing material and is adapted to fit closely around lower housing 221, forming thereby a vertical linear guide for raising and lowering pedestal apparatus 215 reliably with no eccentric loads.

Vacuum integrity is maintained for the overall assembly while allowing vertical freedom of motion for the pedestal apparatus by a metal bellows 233 which seals between flange 227 at a lower end and a flange 229 affixed by its outer diameter to the lower end of lower cylindrical housing 221. Flange 229 is stationary, as it is a part of lower housing 221 attached to housing 211 which is mounted to base chamber 203. Flange 227, by virtue of being attached to lower extension 225 of pedestal apparatus 215, travels up and down with pedestal apparatus 215. As the pedestal apparatus is lowered, bellows 233 extends, and as pedestal apparatus 215 is raised, bellows 233 retracts. The pedestal apparatus is restrained in its vertical path by the inside diameter of flange 229 and primarily by the internal bearing within cylinder 223.

In regard to drive assembly 209 and raising and lowering the pedestal apparatus, it remains to describe the mechanisms by which pedestal apparatus 215 is translated between the lowermost position (FIG. 2E and the uppermost position (FIG. 2D). Referring now primarily to FIG. 2A, drive assembly 209 includes an electrically actuated and powered linear actuator 235 in this embodiment having an extensible shaft 237 within a guide housing 238, wherein the extensible shaft may be extended and retracted within housing 238 as initiated by control signals received from a control system not shown. One end of extensible shaft 237 is pivotally attached by a clevis 239 to upper housing 211 of the drive assembly. A yoke assembly 241 comprising a U-shaped track encircles the body of cylinder 223 (which is fixedly attached to pedestal assembly 215) and is pivotally attached at the ends of the U-shaped track to opposite ends of a clamp bar 243, and the clamp bar clamps on drive housing 238.

Referring now to FIGS. 2B and 2C, yoke assembly 241 engages two bearings 245 which are mounted to opposite sides of cylinder 223. Referring now to FIG. 2B, at the center of the curved end of the U-shaped track of cam-track/yoke assembly 241, one end of an adjustable-length link 247 is pivotally fastened by a clevis 249. The opposite end of link 247 is fastened again to housing 211 by a clevis 251.

In the arrangement described above, as extensible shaft 237 is extended, the yoke assembly is moved as a lever having the attachment at clevis 249 as a fulcrum, such that cylinder 223 is lowered a distance about one-half the length that shaft 237 is extended, causing the entire pedestal assembly be lowered relative to the process chamber and the base chamber. As shaft 237 is retracted the pedestal assembly is similarly raised relative to the base and process chambers.

It will be apparent to those with skill in the art that there are other mechanisms by which the pedestal assembly may be translated relative to the base and process chambers, and there are a variety of alterations in the mechanisms shown that might be made without departing from the scope of the invention. There are, for example, a number of different extensible drives that might be used, such a air cylinders, air-oil systems, hydraulic systems, and the like. The embodiment described provides smooth translation and accuracy.

In an aspect of the present invention vertical movement of the pedestal assembly, which provides for a lower position for inserting and retrieving wafers through extension 205, and an upper position wherein a wafer on the pedestal is presented upward into the processing chamber for processing, also provides for a different pumping speed between the upper position and the lower. Also the elements that make this possible also allow for easy alteration of the actual pumping speed in the process position. These features are best understood with reference to FIGS. 2D and 2E.

Referring to FIGS. 2D and 2E a ring-shaped liner 253 is positioned at the point that base chamber 203 joins process chamber 204. The inside diameter of liner 253 determines area of an annular passage 255 (FIG. 2D) formed between liner 253 and the top edge of pedestal 215 when the pedestal is in the uppermost position. Liner 253 is also made of a material that has a relatively low coefficient of conductive heat transfer, and thereby provides protection for the parts of the process chamber and the base chamber that are closest to the heated pedestal while the pedestal is in the processing (uppermost) position. In conjunction with liner 253, pedestal 215 is provided with an annular shroud 257 which is attached pedestal and forms a shaped pumping annulus. When pedestal 215 is in the uppermost position the upper annulus that shroud 257 forms with the body of pedestal 215 mates with annulus 255 by the upper rim of the shroud mating with liner 253. Referring to FIG. 2D it is clear that the passage for pumping from the process chamber through side outlet pumping port 213 is through the annular passage formed between shroud 257 and the body of pedestal 215.

Referring now to FIG. 2E, wherein pedestal 215 has been moved to the lowermost position for transfer of wafers in and out of the station, it is clear that gases from the process area may still pass through the shroud annulus described above, but may also pass around the outside of the shroud through region 259 and thence to region of housing 211 and out through pumping port 213.

It is well-known to those with skill in the art that pumping speed needs to be relatively high after processing and during wafer transfer, and has to be throttled to a lower, controlled speed during processing to assure total gas pressure during processing. In conventional systems this is accomplished by throttling valves and the like, typically in the pumping port of a chamber. In this aspect of the present invention this difference accrues simply by virtue of vertical translation of the pedestal assembly with the attached pumping shroud. In this aspect a throttling valve may still be used for precise process pressure control.

It will be apparent to those with skill in the art that one design for the liner and shroud will not provide for a broad variety of processes, both CVD and PECVD, which may require quite different pumping speeds in process. In the embodiment described of the present invention, for a different process, it is only necessary to remove the pedestal and replace the shroud and liner, which may be done at a planned downtime for routine maintenance and cleaning. Moreover, this replacement is a relatively simple matter due to unique design of other aspects of the chamber, as will be described more fully below.

Referring now to FIGS. 2A through 2D, the process region is closed by a lid assembly 261 comprising a lid ring 263, an insulator ring 265 and a gas diff-user assembly 267. Gas diffuser assembly 267 has ports not shown for introducing process gases, internal passages for conducting the process gases to the process chamber, and diffuser elements within the process region for distributing process gases evenly over a wafer on pedestal 215 in position in the process chamber to be processed. Such ports, passages and distribution elements are well-known in the art.

Diffuser 267 is nested in an insulator ring 265 which provides electrical and thermal insulation for the diffuser assembly, and allows the diffuser assembly to be electrically biased relative to other elements as required in various process recipes. Such bias may be used to, for example, provide for exciting the process gases in the chamber to form a plasma, as known in plasma-enhanced CVD processes. Insulator ring 265 joins to lid ring 263 and to diffuser 267 in a manner with vacuum seals to provide vacuum integrity and to provide also a rigid lid assembly. In a preferred embodiment lid assembly 261 is hinged to process chamber 204 with a removable vacuum seal, making access for cleaning and maintenance relatively facile and routine. In other embodiments the lid may be mounted differently and completely removed for access.

Referring now primarily to FIGS. 2D and 2E access to the inside of the process chamber may be made by releasing lid assembly 261 and moving it out of the way. At the bottom of station 201 easy access is provided to flange 227 where the lower portion 225 is fastened to flange 227. With the lid assembly open one may dismount pedestal assembly 215 from flange 227 and remove it from the processing station out the open top. This feature provides quick and simple access to portions of the processing chamber requiring cleaning and maintenance, and also for trading liners and shrouds to provide new and different processing conditions.

Figure 3:
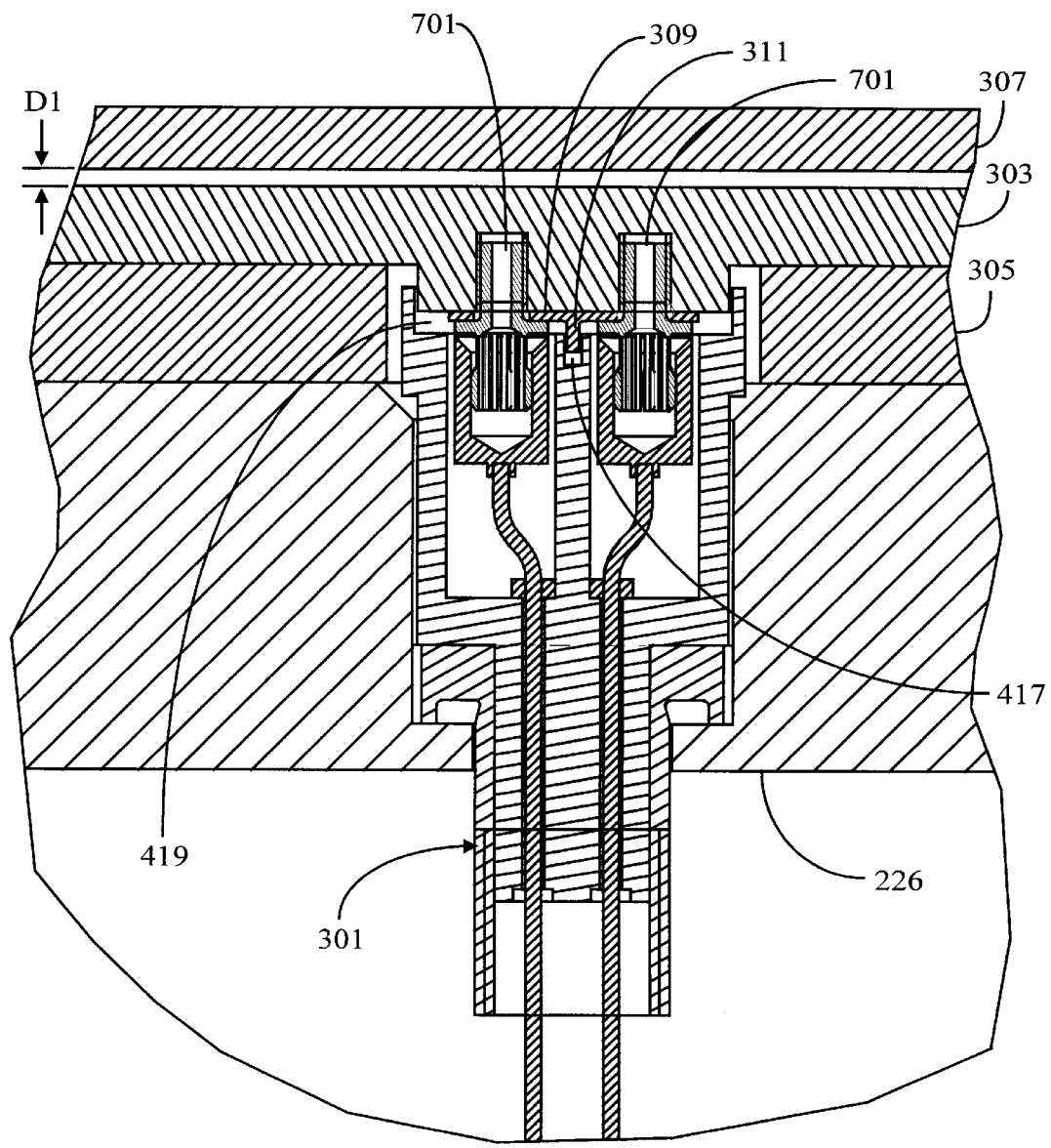
FIG. 3 is an elevation section view through a pedestal element, including an electrical feedthrough apparatus, from FIG. 2E.

Significant improvements over prior art have been provided in the architecture of the upper portions of pedestal 215. FIG. 3 is a partial cross section through the top region of pedestal 215 at about the position of broken circle 269 in FIG. 2D. As described above and as may be seen by reference in particular to FIG. 2C, pedestal 215 is an assembly of an upper structure 224 and a lower extension 225. Upper structure 224 is closed at the top by a closure plate 226, and elements 225, 226, and 224 are assembled with vacuum seals providing an essentially hollow vacuum-tight structure. Upper closure plate 226 supports heater and electrode elements for supporting a wafer during processing as described more fully below with reference to FIG. 3. Closure plate 226 of pedestal assembly 215 is the base plate in FIG. 3, and is water-cooled to maintain operating temperature for vacuum seals, such as conventional o-rings and the like, and for other elements that might be damaged by high temperatures.

Referring now primarily to FIG. 3, closure plate 226 is penetrated in this embodiment in two places by a unique electrical feedthrough unit 301. One such penetration is shown in FIG. 3, but in a preferred embodiment there are two such penetrations serving a unique heater plate to be described in detail below. Feedthrough unit 301 is adapted to closure plate 226 with vacuum seals to preserve vacuum integrity. Feedthrough unit 301 in one penetration of closure plate 226 provides electrical power to heating elements in a heater plate 303, which is spaced apart from closure plate 226 by in electrical insulator plate 305. The function of heater plate 303 is to provide heat to a susceptor 307 upon which a wafer rests during processing.

Susceptor 307 is a mostly graphite structure which has a high coefficient of conductive heat transfer, and is spaced apart from heater plate 303 by a small distance D1. Heater plate 303 provides heat to susceptor 307 by convection and radiation across gap D1, helping to provide a relatively constant temperature across its upper surface, hence over the surface of a wafer, and also providing an efficient electrode for high frequency electrical biasing. The susceptor forms an electrical entity which, for those processes requiring it, is biased through an RF feedthrough, not shown in FIG. 3.

Heater power wires connecting to two feedthroughs 301, to a second feedthrough for RF power, and miscellaneous other conduits and connectors are provided to the region of the lower surface of closure plate 226 by being guided up through the hollow interior of pedestal assembly 215 (See FIGS. 2C, D, and E). Such wires and conduits for supplying power and other utilities to pedestal 215 subassemblies and elements are not shown in these views to promote simplicity, and extend generally from external power and utility supplies as known in the art.

There are several other vacuum-sealed penetrations through closure plate 226 in the preferred embodiment described herein, but not specifically shown in the drawing figures. These include thermocouples with appropriate feedthroughs for sensing temperature of internal elements and at least one optical sensor for monitoring temperature of the susceptor. Such feedthroughs are generally known in the art. An air-cylinder -operated mechanism for translating a pattern of typically three ceramic pins is adapted to the heater/susceptor assembly as well, and is used to raise and lower a wafer from the surface of susceptor 307 to allow a transfer device to extend under a wafer for picking and placing wafers to and from the susceptor plate. In a preferred embodiment a pneumatic cylinder is adapted to the underside of closure plate 226 such that the moving shaft of the cylinder may be extended through an opening in the closure plate via a bellows seal. The pneumatic cylinder has a one-half inch stroke and operates a spider positioned below the heater that carries three ceramic pins that extend through small openings in the heater and the susceptor plate.

When pedestal 215 is retracted as shown in FIG. 2E so a wafer may be transferred, a wafer on susceptor 307 may be lifted off the upper surface of the susceptor by the ceramic pins referred to above, actuated by the pneumatic cylinder described. A transfer arm (see FIG. 1A, item 103) may then extend into the process station beneath the a wafer on the pins but above the susceptor. Retracting the pins then places the wafer on the transfer arm, which may then be withdrawn along with the wafer. The process may be reversed for placing a new wafer to be processed on the susceptor.

Figure 4A:
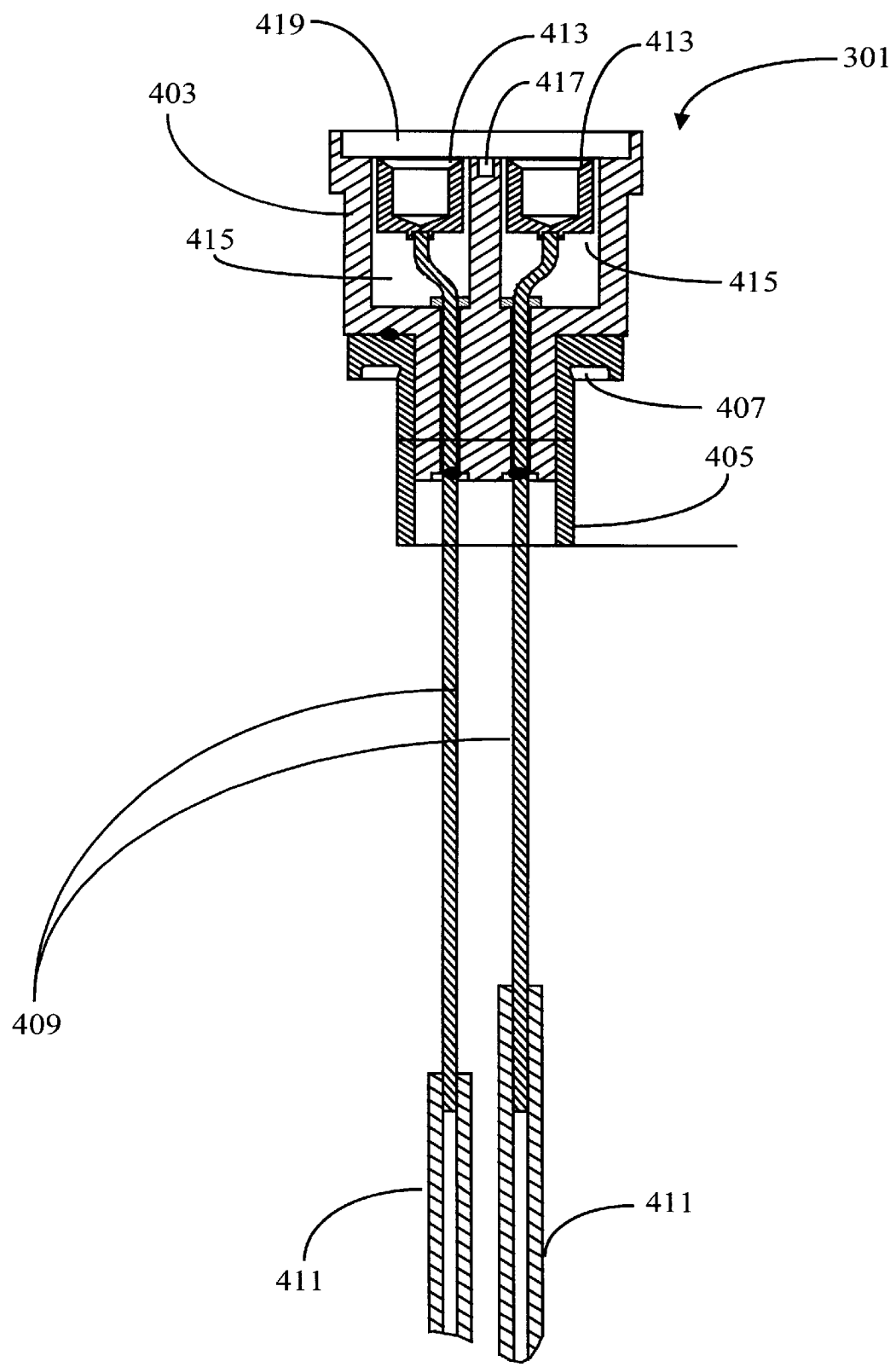
FIG. 4A is an elevation cross-section of the electrical feedthrough apparatus of FIG. 3.

Feedthrough 301 of FIG. 3 is shown isolated in FIG. 4A. A ceramic body portion 403 is joined by intermetallic bonding in this embodiment to a metal body portion 405 which has a seal grove 407 for a vacuum seal such as an o-ring, forming a unitary body sealable through an appropriate opening in closure plate 226 (FIG. 3). Solid nickel wires 409 are sealed through ceramic body portion 403 also by intermetallic bonding as known in the art, and are joined to conventional power wires 411 such as by soldering, at a distance great enough from the feedthrough that conducted heat will not be a problem.

On the vacuum side of feedthrough 301 nickel wires 409 are joined to sockets 413 assembled in openings 415 in ceramic body portion 403 and adapted for receiving posts from heater plate 303 (FIG. 3). The posts are described more fully below. Sockets 413 are constrained in the vertical direction by wires 409, which have considerable stiffness. Openings 415 are somewhat larger in diameter than the diameters of sockets 413, allowing sockets 413 lateral freedom of movement (wires 409 offer little resistance to lateral movement). This freedom of lateral movement allows for some movement and misalignment when assembling a heater plate having posts (as further described below) to a closure plate.

Figure 4C:
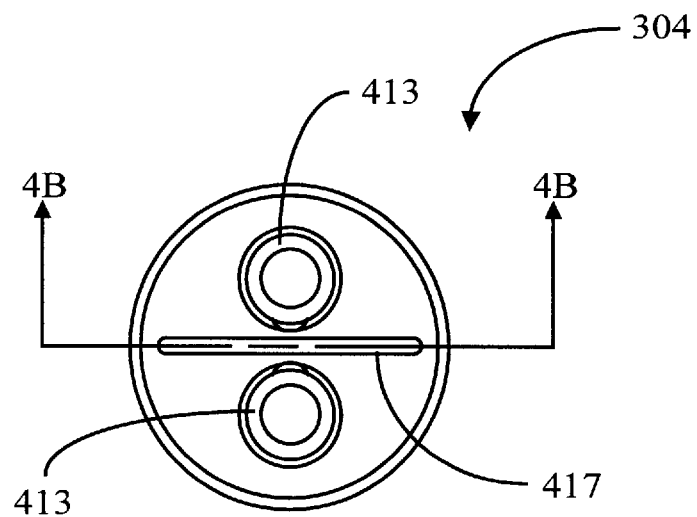
FIG. 4C is a top view of the feedthrough apparatus of FIG. 4A.
Figure 4B:
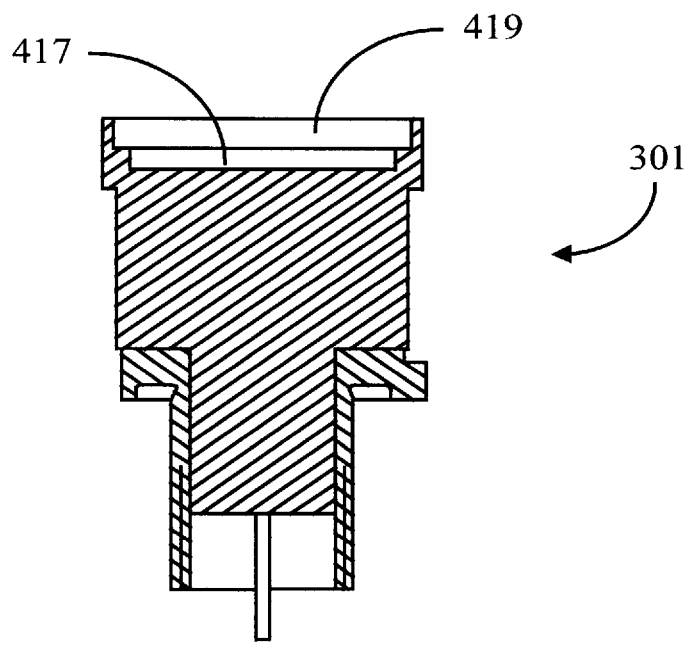
FIG. 4B is a section view taken through a body assembly of the feedthrough of FIG. 4A, taken along section line 4B—4B of FIG. 4C.

FIG. 4C is a top view of feedthrough 301 of FIG. 4A, and FIG. 4B is a section view taken through the body assembly of feedthrough 301 along section line 4B—4B of FIG. 4C, which is substantially rotated ninety degrees from the section of FIG. 4A. Section view 4B is along a groove 417 in ceramic body portion 403 below a circular declavity 419. Declavity 419 receives a circular portion of heater plate 303 from which connector posts extend, and groove 417 receives a baffle extension 311 of a ceramic insulator barrier 309 which serves to prevent line-of-sight electrical interaction between individual posts of the electrical feedthrough.

Figure 5A:
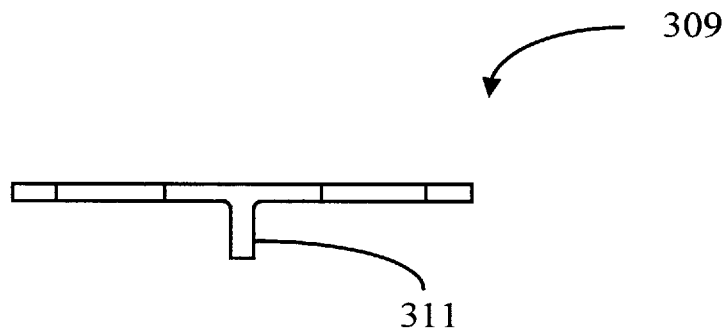
FIG. 5A is a side elevation view of a ceramic insulator barrier from FIG. 3.
Figure 5B:
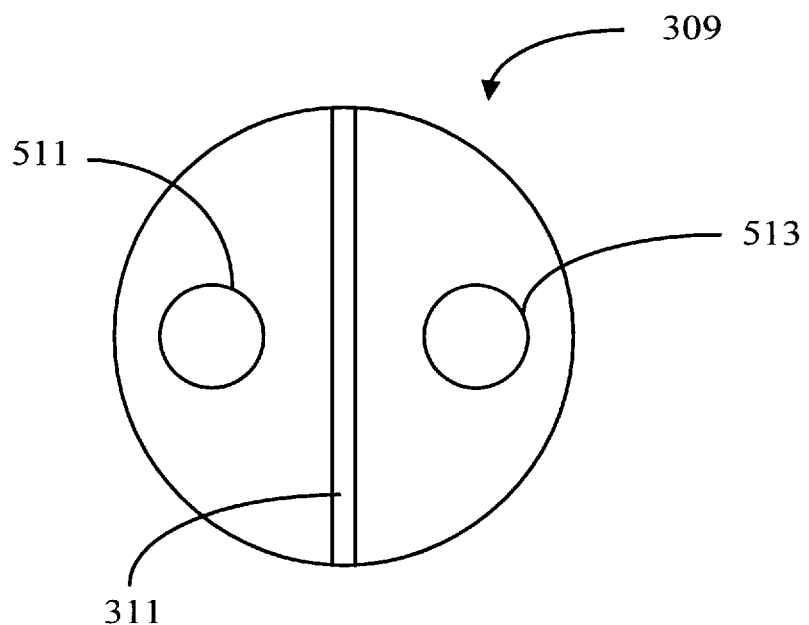
FIG. 5B is a plan view of the insulation barrier shown in side view in FIG. 5A.

FIG. 5A and B show a top view and a side view of ceramic insulator barrier 309, which has an overall diameter great enough to encompass the position of both sockets 413. Barrier 309 has circular openings 511 and 513 in this embodiment which are adapted to allow posts assembled to heater plate 303 to pass through in a manner that is described in more detail below. Baffle extension 311 of barrier 309 extends as a barrier wall across the diameter of barrier 309 at substantially ninety degrees to the flat body of the ceramic barrier, and is adapted to engage groove 417 when a heater plate is assembled to a pedestal in the embodiment described.

FIG. 6A is an isometric view of heater plate 303 of FIG. 3. FIG. 6B is a plan view of the same heater plate, and FIG. 6C is a side view. Heater plate 303 in this embodiment is a unique two-zone heater having an inner region 603 and an outer region 605 separated by a dual channels 607 and 609 which pass through the thickness of the heater plate. Inner region 603 is adapted to be about the diameter of a wafer to be placed on a susceptor over the heater, and outer region 605 encompasses substantially the remainder of the area of the heater plate. Heater plate 303 in this embodiment is a ceramic assembly with thin-film heating elements.

Two separate connector-post structures 611 are constructed on heater plate 303 in this embodiment, one to serve inner region 603 and the other to serve outer region 605. The provision of two separate regions capable of being powered independently allows tuning heat distribution to combat edge effects in heating a wafer on a susceptor overlying the two-zone heater, which allows a wafer to be heated evenly all the way to the outer diameter, a significant advance over prior art heaters.

FIGS. 7A, B, and C illustrate a unique connector post 701 used in the present embodiment in conjunction with the heater plate and socket assembly described above with reference primarily to FIGS. 4A, B, and C. FIG. 7A is an isometric view of connector post 701, FIG. 7B is an enlarged end view, and FIG. 7C is a section view taken along section line 7C—7C of FIG. 7B.

Connector post 701 has a threaded portion 703, a flange 705 and a flexible-finger post extension 707. The overall length in the present embodiment is about one-half inch, with about one-quarter inch devoted to each of the threaded portion and the post extension, but larger and smaller posts may be used in other embodiments. The thread for the threaded portion is preferably a fine thread, but several different thread sizes may be used.

In the preferred embodiment shown in FIGS. 7A, B and C post extension 707 of connector post 701 is divided into 12 equal flexible fingers such as fingers 709 illustrated. The connector post is typically made from a chemically-resistant material such as one of several types of stainless steel, and is heat treated in a manner known in the art to provide for appropriate spring tension of the fingers.

Referring now to FIGS. 6A, B and C, each connector-post structure 611 has a raised land 601 with two threaded holes. An insulator barrier 309 is placed on each raised land, and connector posts 701 are threaded through openings 511 and 513 in the insulator barrier such that flanges 705 capture and hold the insulator barriers against the heater plate. This assembly is clearly illustrated with reference to FIG. 3. Heater plate 303 is designed so that the threaded holes allow each heater post to mate with an appropriate heating element in the heater plate. It will be apparent to those with skill in the art that there are many alternative arrangements that might be made in heater design to utilize the unique structure described.

Referring again to FIG. 3, feedthrough penetrations with feedthroughs 301 are provided in closure plate 226 in the pattern required to mate with connector-post structures 611 of a heater plate 303. When a heater plate is assembled to a closure plate, the raised land 601 of each connector-post structure engages circular declavity 419 (see also FIGS. 4A and 4B). At the same time baffle extension 311 of insulator baffle 309 engages groove 417, creating a no-line-of-sight connection. As described above, sockets 413 on wires 409 of feedthrough 301 allow some lateral movement, which, together with the flexible fingers of the posts ensures facile and positive engagement.

In the preferred embodiment described herein there are two connector-post structures providing power connection to two separate heater regions in a single heater plate. In this embodiment a separate single-post structure not illustrated but using the same socket and post arrangement (but single post) provided for high frequency connection for RF biasing in plasma-enhanced CVD (PECVD) processes. It will be apparent to those with skill in the art, however, that there may be more or fewer connector-post structures, and a dual post feedthrough may well be used for high-frequency biasing as well.

It will be apparent to those with skill in the art that there are many alterations in detail and scale that may be made in the embodiments described herein without departing from the spirit and scope of the present invention. Many such variations have already been mentioned. There are many others. For example, there are many wafer sizes presently in use in integrated circuit manufacturing, and processing stations according top embodiments of the present invention may be constructed to accommodate individual wafer sizes or a range of wafer sizes. A station according to the invention might, for example, be sized to accommodate wafers of up to 12 inches or more in diameter, but be fitted with heater structure to properly, evenly, and efficiently heat a wafer of nominal eight-inch diameter.

As another example of the breadth of the present invention, drive assembly 209 described in detail above provides an efficient, smooth and extremely long-life drive for raising and lowering a pedestal assembly in various embodiments of the present invention. There are many variations in this drive that might be used, though, and even completely different drives that might be incorporated in some embodiments while retaining a unique inventive difference over the existing art.

As a further example, there are many material substitutions that might be made in many elements of the present invention, such as for the material of the heater plate and for the susceptor. In view of the broad range of variations that may be made, the invention is limited only by the scope of the claims which follow:

What is claimed is:

1. A processing station for a cluster tool system, comprising:
    a substantially circular chamber having first inside diameter defining a lower extremity of an upper processing region, a vacuum pumping port and a substrate transfer port below the first inside diameter, and a second inside diameter substantially larger than the first inside diameter below the first inside diameter;
    a substrate support pedestal having a substantially circular upper support surface with an outside diameter less than the first inside diameter and adapted to the base chamber portion below the transfer port by a dynamic vacuum seal allowing vertical translation; and
    a vertical-translation drive system adapted to translate the substrate support pedestal to place the upper support surface at a processing position substantially even with the first inside diameter, or at a lower transfer position in a region of the chamber having the second inside diameter, the transfer position below the transfer port;
    wherein, with the substrate support pedestal at the processing position the outside diameter of the substrate support pedestal and the first inside diameter form a first annular pumping passage having a first annular area determining a first limited pumping speed from the upper processing region of the chamber, and with the substrate support pedestal at the lower transfer position, the outside diameter of the substrate support pedestal and the second inside diameter form a second annular pumping passage having a second annular area greater area than the first annular area, allowing a second pumping speed from the upper processing region greater than the first limited pumping speed.

2. The processing station of claim 1 wherein the first inside diameter is formed by a replaceable ring, thereby allowing the first pumping speed to be incrementally varied by interchanging replaceable rings having constant outer diameter and differing inner diameter.

3. The processing station of claim 1 further comprising an annular shroud surrounding a portion of the substrate pedestal beginning at the substantially circular upper support surface and extending below the substantially circular upper support surface, wherein the diameter of the annular shroud at the height of the substantially circular upper support surface is substantially equal to the first inside diameter, such that, with the substrate support pedestal in the processing position the annular shroud mates with the first inside diameter constraining all gas flow from the processing chamber to flow within the annular shroud between the annular shroud and the substrate support pedestal.

4. The processing station of claim 1 further comprising a demountable lid closing an upper extremity of the chamber and wherein the dynamic vacuum seal is a demountable seal, such that the lid and the dynamic vacuum seal may be demounted, allowing the substrate support pedestal to be withdrawn from within the chamber upward through the chamber.

5. The processing station of claim 4 wherein the demountable lid comprises a gas distribution system for providing processing gases evenly over an exposed surface of a substrate supported on the substrate support pedestal with the substrate support pedestal in the processing position.

6. The processing station of claim 1 wherein the substrate support pedestal comprises a closure plate parallel with the upper support surface and forming a vacuum boundary for the processing chamber, a heater plate on the processing chamber side thermally-insulated from the closure plate, and an electrically-isolated susceptor spaced-apart from and above the heater plate, the susceptor forming the upper support surface.

7. The processing station of claim 6 wherein the heater plate is a substantially circular heater plate having separately-powered inner and outer heating regions, allowing temperature profile across the plate to be managed by managing power to the separately-powered inner and outer heating regions.

8. The processing station of claim 7 wherein the inner heating region is separated from the outer heating region by at least one circular-arc groove through the heater plate.

9. The processing station of claim 7 wherein the inner heating region has a diameter substantially equal to the diameter of a substrate to be heated by the heater plate.

10. The processing station of claim 1 wherein the dynamic vacuum seal is a stainless steel bellows.

11. A substantially-circular and substantially planar two-zone heater plate for heating a substrate placed on a susceptor parallel to the heater plate, the heater plate comprising;
    a first substantially circular central region powered by a first set of electrical connectors; and
    a second substantially annular outer region surrounding the first region and powered by a second set of electrical connectors;
    wherein the central region is separated from the outer region by at least one groove extending fully through the planar heating plate and defining a circular arc, leaving a material bridge joining the inner and outer regions.

12. The heater plate of claim 11 wherein the electrical connectors comprise at least one electrical contact post extending at a right angle from the plane of the substantially planar heater plate, the electrical contact post comprising a plurality of electrically-conductive, cantilevered-spring fingers arranged in a circular pattern and adapted to engage an electrically conductive hollow cylindrical socket to provide electrical contact.

13. The heater plate of claim 12 wherein each set of electrical connectors comprises two of the cantilevered-spring finger contact posts in near proximity.

14. The heater plate of claim 13 wherein the two electrical contact posts serving each region pass through and secure an electrical insulator barrier against the heater plate, the electrical insulator barrier having a wall portion extending at right angles to the plane of the heater plate and bisecting the two electrical contact posts.

15. An electrical contact structure for a substantially planar heating plate, comprising:

a raised circular land having a planar upper surface with two tapped holes therein, the two tapped holes positioned on a line forming a diameter of the raised circular land and positioned substantially equadistant from the center of the raised circular land;

an insulator barrier structure comprising a planar circular portion equal in diameter to the raised circular land, having two holes through the circular portion spaced equal to the two threaded holes in the raised circular land, and having a wall portion extending at right angles to the plane of the planar circular portion and bisecting the planar circular portion at a right angle to the line joining the centers of the two holes; and two contact posts each having a threaded end, a central shoulder flange, and an unthreaded end;

wherein the threaded ends of the two contact posts pass through the two holes in the insulator barrier structure, the central shoulder flanges trap the planar circular portion of the insulator barrier structure against the raised circular land, and the unthreaded ends of the contact posts extend away from the planar circular portion of the insulator barrier structure, the wall portion of the insulator barrier structure forming a line-of-sight barrier between the two contact posts.

16. The electrical contact structure of claim 15 wherein the unthreaded ends of the contact posts each comprise a plurality of electrically-conductive, cantilevered-spring fingers arranged in a circular pattern and adapted to engage an electrically conductive hollow cylindrical socket to provide electrical contact.

17. An electrical feedthrough comprising:

a body having a flange and vacuum seal arrangement adapted to mount through an opening through a vacuum barrier wall, presenting thereby a vacuum side and a non-vacuum side through the vacuum barrier wall, and having also a non-electrically-conductive portion presented to both the vacuum side and the non-vacuum side with a first circular opening having a first depth and a first inside diameter opening to the vacuum side;

at least one electrically-conductive post sealed through the non-conductive portion from the non-vacuum side into the first circular opening on the vacuum side; and an electrically-conductive socket having a second circular opening and an outside diameter less than the first inside diameter, the electrically conductive socket mounted in the first circular opening in the non-electrically-conductive portion and connected to the electrically conductive post within the first circular opening;

wherein the electrically-conductive socket is free to move laterally within the first circular opening, but is not free to move along the direction of the first depth.

18. The electrical feedthrough of claim 17 comprising two electrically independent post-and socket structures through the non-electrically-conductive portion.

19. The electrical feedthrough of claim 17 wherein the body portion comprises a metal portion in addition to the non-electrically-conductive portion, and the flange and vacuum seal arrangement is implemented in the metal portion.

* * * * *